Sept. 26, 1950

C. E. HALLMARK 2,523,294

SELF-TUNING AMPLIFIER

Filed March 16, 1946

INVENTOR
CLYDE E. HALLMARK

BY

ATTORNEY

Patented Sept. 26, 1950

2,523,294

UNITED STATES PATENT OFFICE 2,523,294

SELF-TUNING AMPLIFIER

Clyde E. Hallmark, Fort Wayne, Ind., assignor, by mesne assignments, to Farnsworth Research Corporation, a corporation of Indiana Application March 16, 1946, Serial No. 654,948

13 Claims. (Cl. 179—171)

Figures 1, 2:
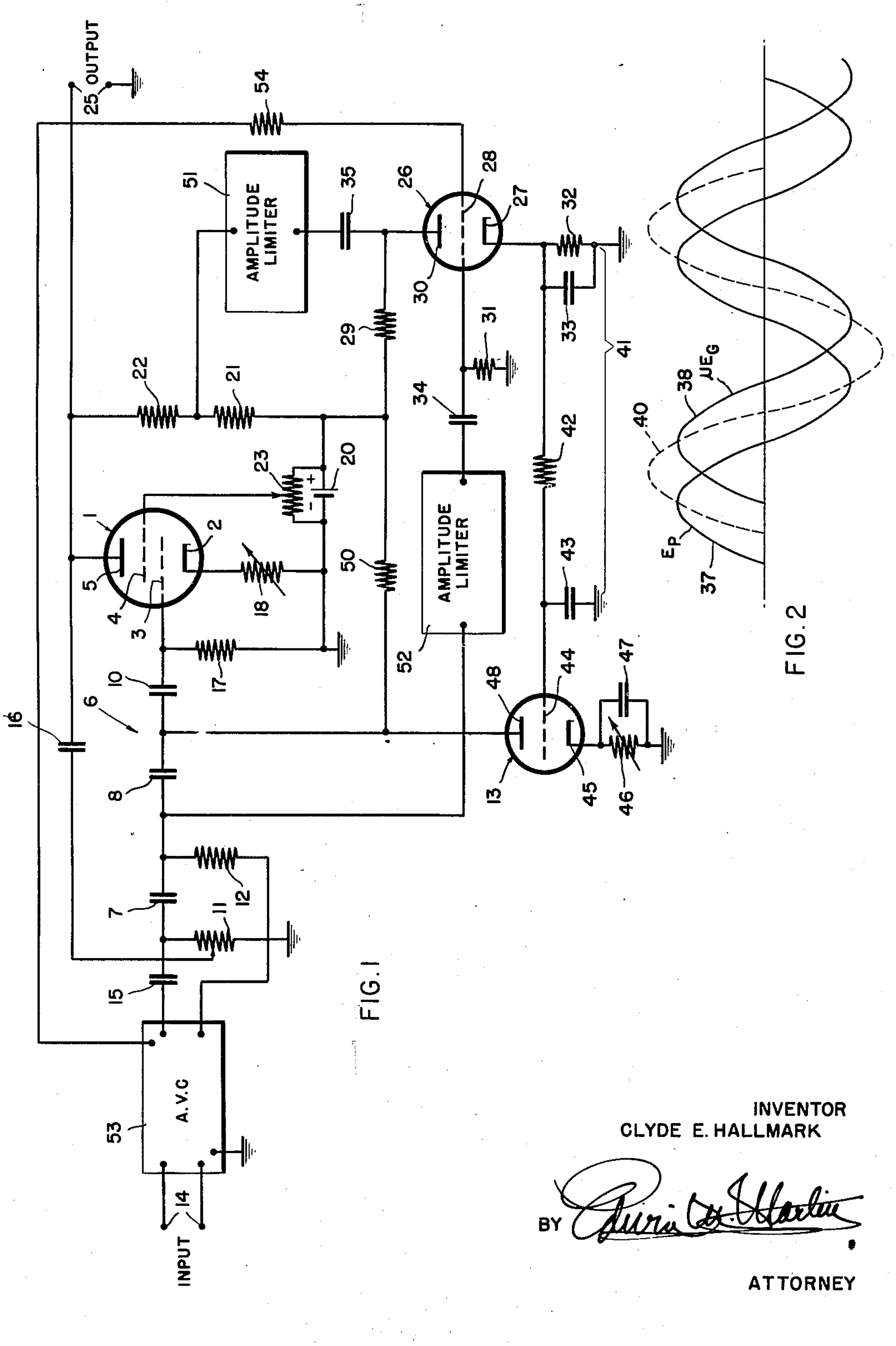

This invention relates generally to amplifiers and particularly relates to a tuned amplifier which will tune itself automatically to the frequency of the input wave.

Tuned amplifiers are used extensively in the radio and television art. A tuned amplifier has a gain versus frequency curve which exhibits maximum gain at a certain frequency, that is, at that frequency for which the amplifier is tuned. These amplifiers are used, therefore, in radio or television receivers to discriminate against unwanted signals. However, since the gain curve falls rapidly for frequencies other than the resonant frequency, the amplifier must be tuned to the frequency of the wave to be amplified. When the amplifier is thus tuned, it will amplify the input wave with maximum gain. An amplifier is usually tuned manually by varying the resonant frequency of a tuned circuit which may be effected, for example, by rotating a tuning condenser. For some purposes, however, it would be desirable to provide an amplifier which will automatically tune itself to the frequency of an input wave within a certain frequency range. In the intermediate frequency channel of a superheterodyne receiver tuned amplifiers are employed. These amplifiers must be carefully aligned or adjusted during manufacture to the intermediate frequency, a procedure which is time consuming and expensive.

It has already been proposed to tune a receiver automatically by means of electric motors which are utilized for mechanically tuning condensers or coils. However, such mechanical tuning means are inherently slow and lack the flexibility of electronic control means.

It is the principal object of the present invention, therefore, to provide a novel amplifier which will tune itself automatically to the frequency of the wave to be amplified within a certain frequency range.

Another object of the invention is to provide, in a tuned amplifier having a frequency versus gain curve which exhibits maximum gain at a certain frequency, means for shifting the position of the maximum gain to the frequency of the wave to be amplified.

A further object of the invention is to provide a self-tuning amplifier which may be utilized, for example, in the intermediate frequency channel of a superheterodyne receiver and which need not be aligned or adjusted during manufacture.

In accordance with the present invention, there is provided a self-tuning amplifier comprising a vacuum discharge device having input and output electrodes and a feedback circuit coupled between the input and the output electrodes. The feedback circuit is arranged to impart maximum gain to the discharge device at one frequency. Means are provided for impressing an input wave on the input electrode and for deriving an output wave from the output electrode. Means are finally provided for adjusting the characteristics of the feedback circuit in accordance with changes of the phase difference between the input and the output wave to shift the maximum gain to a different frequency.

For a better understanding of the invention, together with other and further objects thereof, reference is made to the following description, taken in connection with the accompanying drawing, and its scope will be pointed out in the appended claims.

In the accompanying drawing, Fig. 1 is a circuit diagram of a self-tuning amplifier embodying the present invention, while Fig. 2 is a graph illustrating curves referred to in explaining the operation of the invention.

Referring to Fig. 1 of the drawing, there is illustrated a self-tuning amplifier comprising vacuum discharge tube 1 which has been illustrated as a tetrode. It is to be understood, however, that instead of tetrode 1, a triode or a pentode may be used. Tetrode 1 comprises cathode 2, control grid 3, screen grid 4 and anode 5. One hundred eighty degrees phase shift network 6 is connected between control grid 3 and anode 5, that is, between the input and output electrodes of tetrode 1. Phase shift network 6 is of the resistor capacitor or RC type and provides a positive feedback path between anode 5 and control grid 3.

Phase shift network 6 comprises three sections, each having a series condenser 7, 8 and 10 and a shunt resistor 11, 12 and 13. Resistor 13 is represented by a variable resistance tube. The input wave obtained from input terminals 14 is impressed upon control grid 3 through coupling condenser 15 and phase shift network 6. Control grid 3 and anode 5 are connected through phase shift network 6 and coupling condenser 16.

Control grid 3 of tetrode 1 is connected to ground through grid leak resistor 17. Cathode 2 is also connected to ground through cathode resistor 18 which is adjustable to provide gain control. Anode 5 is connected to the positive pole of a suitable voltage supply source such as battery 20 through anode resistors 21 and 22. Screen grid 4 is supplied with a suitable positive voltage through a tap on voltage divider 23 connected across battery 20.

Phase shift network 6 provides a loose coupling between control grid 3 and anode 5 so that the amount of feedback introduced by phase shift network 6 is insufficient to sustain oscillations. This is effected by tapping resistor 11 and connecting it to coupling condenser 16. Tetrode 1, therefore, functions as an amplifier and not as an oscillator.

In accordance with the present invention, the frequency for which network 6 introduces a phase shift of 180 degrees is shifted or adjusted in response to changes of the phase difference between the input and the output wave. The output wave may be derived from anode 5 through output terminals 25. Let it be assumed that the frequency of the input wave differs from the frequency for which network 6 imparts a 180 degrees phase shift. Accordingly, the phase of the input wave impressed upon control grid 3 will differ by more or less than 180 degrees from the phase of the wave derived from anode 5. Since the output wave is fed back through network 6 into control grid 3, the phase of the output wave and the phase of the input wave impressed upon input terminals 14 will differ from the normal phase difference between the two waves. This change of the phase difference between input and output wave may be utilized for developing a control signal which will vary the resistance of control tube 13. Accordingly, the frequency for which network 6 introduces a 180 degrees phase shift may be varied.

It will be understood that the gain of tetrode 1 is at its maximum at that frequency for which network 6 introduces a 180 degrees phase shift. For that frequency, the feedback will have a maximum corresponding to the maximum gain of the amplifier. Thus, by adjusting the frequency for which network 6 introduces a 180 degrees phase shift, the gain of tetrode 1 will always be a maximum for the frequency of the input wave.

The control signal utilized for varying the resistance of tube 13 is developed by phase comparator 26 which may, for example, be a triode, as illustrated. Phase comparator 26 comprises cathode 27, control grid 28 and anode 30. Anode 30 is connected to the positive pole of battery 20 through anode resistor 29 to provide a suitable anode potential. Control grid 28 is connected to ground through grid leak resistor 31. Cathode 27 is connected to ground through cathode resistor 32 and by pass condenser 33 arranged in parallel for providing automatic grid bias.

The input wave is impressed upon control grid 28 through coupling condenser 34. Preferably the input wave is obtained from an intermediate point of phase shift network 8 so that the wave impressed upon control grid 28 has a predetermined normal phase difference with respect to that of the output wave obtained from anode 5. The output wave is impressed upon anode 30 through coupling condenser 35. The normal phase difference between the waves impressed upon control grid 28 and anode 30 preferably is 90 degrees. The output wave is preferably obtained from the junction point between anode resistors 21 and 22 so that the amplitude of the wave impressed upon anode 30 is of the same order as the amplitude of the wave impressed upon the control grid 28 multiplied by the amplification factor $\mu$ of phase comparator 26.

Instead of deriving the wave impressed upon control grid 28 from an intermediate point of network 6, it is also feasible to connect input terminals 14 with control grid 28 through coupling condenser 34. In that case, a suitable phase shift network may be provided in one of the leads for impressing the input wave and the output wave upon control grid 28 and anode 30, respectively. The phase shift network arranged in one of the leads should be such that the waves impressed upon grid 28 and anode 30 normally have a predetermined phase difference which preferably amounts to 90 degrees.

Referring now to Fig. 2, there is illustrated curve 37 which represents the wave impressed upon anode 30 of phase comparator 26. Curve 38 represents the wave impressed upon control grid 28 of phase comparator 26 and multiplied by the tube amplification factor $\mu$. As shown in Fig. 2, waves 37 and 38 have a phase difference of 90 degrees. Curve 40 represents the arithmetic sum of input waves 37 and 38. Actually phase comparator 26 is arranged as a rectifier, that is, the tube is operated on a curved portion of the characteristic. Therefore, the lower portion of curve 40, which may be obtained from cathode 27, will be partially or completely suppressed.

Let us assume that the phase difference between curves 37 and 38, that is, the phase difference between the waves impressed upon anode 30 and control grid 28, respectively, increases to 180 degrees. In that case, output curve 40 would be zero because waves 37 and 38 will cancel each other. On the other hand, if the phase difference between curves 37 and 38 decreases to zero degrees, output curve 40 would have an amplitude corresponding to the combined amplitudes of curves 37 and 38. Thus, it will be seen that the amplitude of output curve 40 is responsive to changes of the phase difference between the input wave and the output wave of amplifier 1. Preferably the input wave impressed upon control grid 28 and the output wave impressed upon anode 30 of phase comparator 26 should normally be 90 degrees out of phase. If this condition is satisfied, the control signal developed by phase comparator 26 and obtained from cathode 27 is most sensitive to changes of the phase difference between input and output wave in either direction. It is to be understood, however, that any conventional phase comparator may be substituted for phase comparator 26 illustrated in Fig. 1.

The rectified control signal may be obtained from cathode 27 of phase comparator 26 and may be passed through low pass filter 41 to remove the alternating current components thereof. Low pass filter 41 may include cathode resistor 32 and bypass condenser 33 and, in addition, may comprise series resistor 42 and shunt condenser 43. The time constant of low pass filter 41 may be of the order of $\frac{1}{10}$ second.

The control signal obtained from phase comparator 26 and low pass filter 41 is impressed upon control grid 44 of variable resistance tube 13. Tube 13 comprises cathode 45 connected to ground through adjustable resistor 46 and bypass condenser 47 to provide adjustable grid bias. Anode 48 of variable resistance tube 13 is connected to phase shift network 6 and is supplied with a suitable anode potential through anode resistor 50 connected to the positive pole of battery 20.

The rectified and filtered control signal developed by phase comparator 26 will accordingly vary the resistance of tube 13, thereby to adjust the frequency for which network 6 imparts a 180 degrees phase shift and, at the same time, provide maximum gain of tetrode 1 for that frequency. Since the resistance of tube 13 is controlled in accordance with changes of the phase difference between input and output wave of amplifier 1, network 6 will be adjusted to the frequency of the input wave. By adjusting resistor 46 the normal resistance of tube 13 may be changed, thereby to shift the frequency range within which network 6 may be automatically controlled.

It will be observed that when the frequency of the input wave is in the neighborhood of the frequency for which network 6 is tuned, the amplitude of the waves impressed upon phase comparator 26 are hardly affected but their phase difference will change. Finally, however, the control signal developed by phase comparator 26 is also dependent, to some extent, upon the amplitude of the input and output waves. However, it is desired that the control signal should only be responsive to changes of the phase difference and not to changes of the amplitude of the input and output waves. Therefore, amplitude limiters 51 and 52 may be provided in the leads connected to anode 30 and to control grid 28 of phase comparator 26, respectively. Amplitude limiters 51 and 52 may each consist, for example, of an amplifier operated on the curved portion of the characteristic so that the amplitude peaks of the waves are limited to a predetermined value.

Alternatively, automatic volume control network 53 may be provided between input terminals 14 and network 6 for controlling the amplitude of the input signal impressed upon terminals 14. This may, for instance, be effected by controlling a previous amplification stage which may be arranged in front of input terminals 14. Still another method of keeping the amplitudes of curves 37 and 38 substantially constant is to control the gain of phase comparators 26. To this end, an automatic volume control signal obtained from network 53 may be impressed upon control grid 28 through coupling resistor 54. It is to be understood that amplitude limiters 51, 52 and automatic volume control network 6 may both be omitted.

The self-tuning amplifier of the present invention may be used with advantage, for example, in the intermediate frequency channel of a superheterodyne receiver. In that case, the self-tuning amplifier of the invention need not be aligned or adjusted because it will adjust itself automatically in the manner previously explained to the frequency of the input wave.

The input wave impressed upon input terminals 14 may be a modulated carrier wave or may consist of pulses having a predetermined frequency. It will be obvious that phase comparator 26 is also responsive to changes of the phase difference of input and output pulses impressed thereon.

While there has been described what is at present considered the preferred embodiment of the invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A self-tuning amplifier comprising a vacuum discharge device having input and output electrodes, a feedback circuit coupled between said electrodes, said feedback circuit including components for shifting the phase of the feedback energy suitably to impart maximum gain to said device at one frequency, means for impressing an input wave on said input electrode, means for deriving an output wave from said output electrode, means for deriving a control signal responsive to changes of the phase difference between said input wave and said output wave, and means for adjusting one of said feedback circuit components in accordance with said control signal to shift said maximum gain in response to changes of said phase difference.

2. A self-tuning amplifier comprising a vacuum tube having input and output electrodes, a positive feedback circuit coupled between said electrodes, the amount of feedback introduced by said circuit being insufficient to sustain oscillations, said feedback circuit including components for shifting the phase of the feedback energy suitably to impart maximum gain to said device at one frequency, means for impressing an input wave on said input electrode, means for deriving an output wave from said output electrode, means for deriving a control signal responsive to changes of the phase difference between said input wave and said output wave, and means for automatically adjusting one of said feedback circuit components in accordance with said control signal to shift said maximum gain to the frequency of said input wave.

3. A self-tuning amplifier comprising a thermionic discharge device having input and output electrodes, a positive feedback network coupled between said electrodes, said network including phase shifting components for introducing a predetermined phase shift between said electrodes at a certain frequency, means for impressing an input wave on said input electrode, means for deriving an output wave from said output electrode, means for developing a control signal responsive to changes of the phase difference between said input wave and said output wave, and means responsive to said control signal for automatically adjusting one of said phase shifting network components and thus changing the frequency for which said network introduces said predetermined phase shift, thereby to provide maximum gain at said adjusted frequency.

4. A self-tuning amplifier comprising a vacuum tube having input and output electrodes, a positive feedback network coupled between said electrodes in such a manner that said tube is incapable of sustaining oscillations, said network including phase shifting components for introducing a predetermined phase shift between said electrodes at a certain frequency, means for impressing an input wave on said input electrode, means for deriving an output wave from said output electrode, means for developing a control signal responsive to changes of the phase difference between said input wave and said output wave, and means responsive to said control signal for automatically adjusting one of said phase shifting network components and thus changing the frequency for which said network introduces said predetermined phase shaft to that of said input wave, thereby to provide maximum gain at the frequency of said input wave.

5. A self-tuning amplifier comprising a vacuum tube having input and output electrodes, a positive feed-back network loosely coupled between said electrodes to prevent said tube from oscillating, said network including phase shifting components for introducing a phase shift of 180 degrees between said electrodes at a certain frequency, means for impressing an input wave on said input electrode, means for deriving an output wave from said output electrode, means for developing a control signal responsive to changes of the phase difference between said input wave and said output wave, and means responsive to said control signal for automatically adjusting one of said phase shifting network components and thus changing the frequency for which said network introduces said 180 degrees phase shift to that of said input wave, thereby to provide maximum gain at the frequency of said input wave.

6. A self-tuning amplifier comprising a vacuum tube having input and output electrodes, a 180 degrees phase shift network coupled between said electrodes, said network including a resistor and providing a positive feed-back between said electrodes which is insufficient to sustain oscillations, means for impressing an input wave on said input electrode, means for deriving an output wave from said output electrode, means including a phase comparator for developing a control signal in response to changes of the phase difference between said input wave and said output wave, and means for adjusting said resistor and thus changing the frequency for which said network introduces a 180 degrees phase shift in accordance with said control signal to that of said input wave, thereby to provide maximum gain of said tube at the frequency of said input wave.

7. A self-tuning amplifier, comprising a vacuum tube having input and output electrodes, a resistor capacitor network loosely coupled between said electrodes, said network providing a 180 degrees phase shift between said electrodes at a certain frequency, means for impressing an input wave on said input electrode, means for deriving an output wave from said output electrode, means for adjusting the frequency for which said network provides said 180 degrees phase shift including a variable resistor forming part of said network, means including a phase comparator for developing a control signal in response to changes of the phase difference between said input wave and said output wave, and means for adjusting said variable resistor in accordance with said control signal to a value such that the frequency for which said network introduces a 180 degree phase shift is changed to that of said input wave, thereby to provide maximum gain of said tube at the frequency of said input wave.

8. A self-tuning amplifier comprising a vacuum tube having input and output electrodes, a resistor capacitor network loosely coupled between said electrodes, said network providing a 180 degrees phase shift between said electrodes at a certain frequency, means for impressing an input wave on said input electrode, means for deriving an output wave from said output electrode, means for automatically adjusting the frequency for which said network provides a 180 degrees phase shift including a variable resistance tube forming part of said network, means including a phase comparator for developing a control signal in response to changes of the phase difference between said input wave and said output wave, and means for adjusting said variable resistance tube in accordance with said control signal to such a value as to shift the frequency for which said network introduces said 180 degrees phase shift to that of said input wave.

9. A self-tuning amplifier comprising a vacuum tube having input and output electrodes, a resistor capacitor network loosely coupled between said electrodes, said network providing a 180 degrees phase shift between said electrodes at a certain frequency, means for impressing an input wave on said input electrode, means for deriving an output wave from said output electrode, means for automatically adjusting the frequency for which said network provides a 180 degrees phase shift including a variable resistance tube forming part of said network, means including a phase comparator coupled to said electrodes for developing a control signal in response to changes of the phase difference between said input wave and said output wave, means for keeping substantially constant the amplitude of the waves fed to said phase comparator, and means for adjusting said variable resistance tube in accordance with said control signal to such a value as to shift the frequency for which said network introduces said 180 degrees phase shift to that of said input wave.

10. A self-tuning amplifier comprising a vacuum tube having input and output electrodes, a resistor capacitor network loosely coupled between said electrodes, said network providing a 180 degrees phase shift between said electrodes at a certain frequency, means for impressing an input wave on said input electrode, means for deriving an output wave from said output electrode, means for automatically adjusting the frequency for which said network provides a 180 degrees phase shift including a variable resistance tube forming part of said network, means including a phase comparator for developing a control signal, means for impressing said input wave and said output wave on said phase comparator with a normal phase difference of substantially 90 degrees, means for adjusting said variable resistance tube in accordance with said control signal to such a value as to shift the frequency for which said network introduces said 180 degrees phase shift to that of said input wave.

11. An amplifier comprising a vacuum tube having input and output circuits, a gain control circuit coupled to said tube and including a phase-shift network connected between said input and output circuits for holding the gain of said tube at the maximum at a given frequency, a variable impedance in said network, a phase comparing circuit coupled to said network and to said tube operative to derive a wave representative of frequency change in said gain control circuit, and a circuit coupled to said variable impedance and to said phase comparing circuit operative to vary said impedance in response to said wave.

12. An amplifier comprising a vacuum tube having input and output circuits, a gain control circuit coupled between the input and output circuits of said tube, a variable element in said circuit, a measuring circuit coupled to said gain control circuit and to said tube operative to derive a wave representative of signal frequency change in said gain control circuit, and a circuit coupled to said variable element and to said measuring circuit operative to vary said element in response to said wave for holding the gain of said tube at the maximum.

13. An amplifier comprising a vacuum tube having input and output circuits, a gain control circuit coupled to said tube and including a frequency responsive network connected between said input and output circuits, a variable impedance in said network, a measuring circuit coupled to said network and to said tube operative to derive a wave representative of signal frequency change in said gain control circuit, and a circuit coupled to said variable impedance and to said measuring circuit operative to vary said impedance in response to said wave for holding the gain of said tube at the maximum.

CLYDE E. HALLMARK.

REFERENCES CITED

The following references are of record in the file of this patent:

UNITED STATES PATENTS

| Number | Name | Date |
|---|---|---|
| 2,173,426 | Scott | Sept. 19, 1939 |
| 2,221,096 | Keall et al. | Nov. 12, 1940 |
| 2,300,632 | Poch | Nov. 3, 1942 |
| 2,321,269 | Artzt | June 8, 1943 |
| 2,341,232 | Norton | Feb. 8, 1944 |
| 2,413,263 | Suter | Dec. 24, 1946 |